US006885228B2

(12) United States Patent
McWilliams

(10) Patent No.: US 6,885,228 B2
(45) Date of Patent: Apr. 26, 2005

(54) NON-ITERATIVE SIGNAL SYNCHRONIZATION

(75) Inventor: John L. McWilliams, Vancouver, WA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/262,791

(22) Filed: Oct. 2, 2002

(65) Prior Publication Data

US 2004/0066221 A1 Apr. 8, 2004

(51) Int. Cl.[7] .............................................. H03L 7/06
(52) U.S. Cl. .................... 327/158; 327/161; 327/160; 327/159; 327/149
(58) Field of Search .......................... 327/141, 147–149, 327/153–161

(56) References Cited

U.S. PATENT DOCUMENTS

| 5,212,716 A | 5/1993 | Ferraiolo et al. ............ 375/119 |
| 5,438,353 A | 8/1995 | Morrison ..................... 347/250 |
| 5,463,337 A | 10/1995 | Leonowich .................. 327/158 |
| 5,477,330 A | 12/1995 | Dorr ........................... 358/296 |
| 5,760,816 A | 6/1998 | Morrison ..................... 347/247 |
| 5,793,709 A | 8/1998 | Carley ......................... 368/113 |
| 5,940,608 A | 8/1999 | Manning ...................... 395/558 |
| 5,945,862 A | 8/1999 | Donnelly et al. ........... 327/278 |
| 5,949,260 A * | 9/1999 | Toda ........................... 327/149 |
| 5,990,923 A | 11/1999 | Morrison ..................... 347/252 |
| 6,052,011 A | 4/2000 | Dasgupta ..................... 327/270 |
| 6,215,343 B1 | 4/2001 | Birru .......................... 327/158 |
| 6,232,812 B1 | 5/2001 | Lee ............................. 327/277 |
| 6,236,427 B1 | 5/2001 | Roylance et al. ........... 347/249 |
| 6,259,467 B1 | 7/2001 | Hanna ......................... 347/249 |
| 6,289,068 B1 | 9/2001 | Hassoun et al. ............. 375/376 |
| 6,300,807 B1 * | 10/2001 | Miyazaki et al. ........... 327/158 |
| 6,335,751 B1 | 1/2002 | Morrison ..................... 347/235 |
| 6,340,986 B1 | 1/2002 | Morrison et al. ............ 347/249 |
| 6,366,307 B1 | 4/2002 | Morrison ..................... 347/249 |
| 6,390,579 B1 | 5/2002 | Roylance et al. ............ 347/9 |
| 6,573,776 B1 * | 6/2003 | Miyamoto ................... 327/276 |
| 2001/0033630 A1 | 10/2001 | Hassoun et al. ............. 375/376 |
| 2003/0227308 A1 * | 12/2003 | Cooper ........................ 327/158 |

FOREIGN PATENT DOCUMENTS

| GB | 2 346 275 | 8/2000 | .......... H03L/7/081 |
| WO | WO 87/01534 | 3/1987 | ............ H03L/7/06 |
| WO | WO 99/67882 | 12/1999 | .......... H03L/7/081 |

* cited by examiner

*Primary Examiner*—Quan Tra

(57) ABSTRACT

Non-iterative signal synchronization is disclosed. A system of one embodiment of the invention has a provider and a mechanism. The provider provides two signals. The mechanism non-iteratively synchronizes one of the signals with the other of the signals, based on a pulse indicative of a phase difference between the signals.

28 Claims, 7 Drawing Sheets

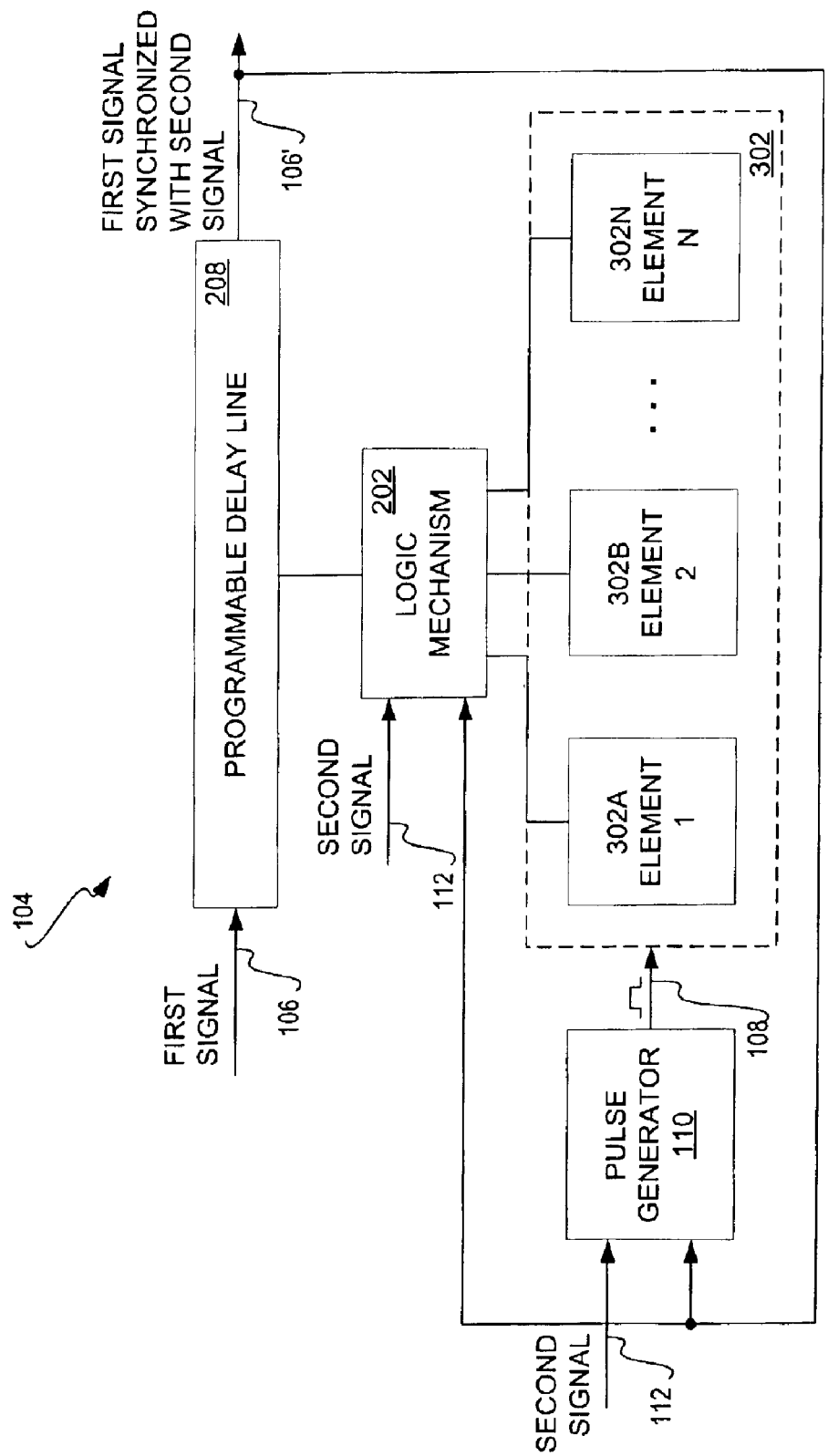

NON-ITERATIVE SIGNAL SYNCHRONIZATION

BACKGROUND

In electronic circuits, two signals may need to be synchronized with one another. Synchronization generally means that both signals rise and/or fall at the same time, where typically the signals already have the same period. One way of accomplishing signal synchronization is to introduce a phase delay into one of the signals equal to the difference between their current phases.

A circuit for introducing a phase delay into one signal so that it becomes synchronized with another signal may utilize an iterative approach. For example, the two signals may be out of synch by five nanoseconds, and a given delay circuit may be capable of introducing an additional one-nanosecond delay into one of the signals each time it is called. Therefore, the circuit may be called upon five times to synchronize the signals. However, iterative approaches may have to be called a number of times, and thus may be relatively slow in performance.

SUMMARY OF THE INVENTION

The invention can be embodied in a system having a provider and a mechanism. The provider provides two signals. The mechanism non-iteratively synchronizes one of the signals with the other of the signals, based on a pulse indicative of a phase difference between the signals.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIGS. 3A and 3B are diagrams of a mechanism to non-iteratively synchronize a first signal with a second signal, according to varying embodiments of the invention.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

System and Overview

Figure 1:
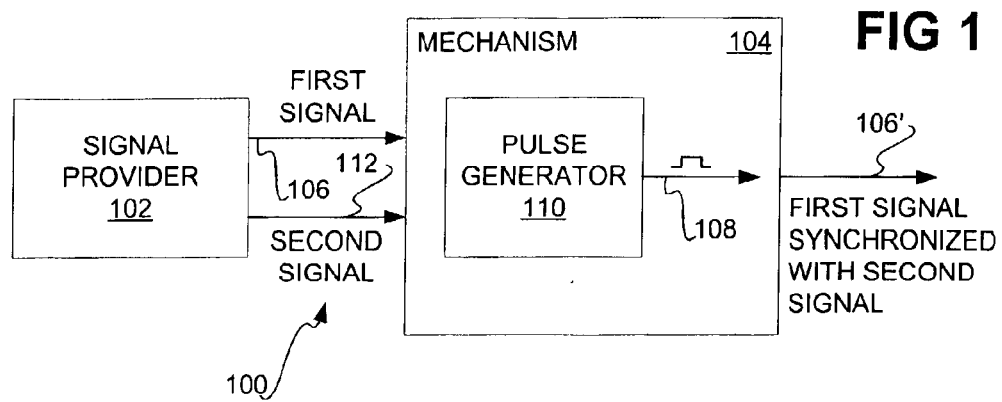
FIG. 1 is a diagram of a system according to an embodiment of the invention.

FIG. 1 shows a system 100 according to an embodiment of the invention. The system 100 includes a signal provider 102 and a mechanism 104. Each of the provider 102 and the mechanism 104 can be implemented as hardware, software, or a combination of hardware and software. Each of the signal provider 102 and the mechanism 104 can be considered as the means for performing its respective functionality. The signal provider 102 provides a first signal 106 and a second signal 112 that may be out of synchronization with respect to one another. Each of the signals 106 and 112 may be a clock signal or another type of signal. In one embodiment, each of the signals 106 and 112 has the same period, however. Furthermore, the signal provider 102 may provide other inputs to the mechanism 104 other than the signals 106 and 112. In one embodiment, the provider 102 is part of a system other than the system 100.

The mechanism 104 synchronizes the first signal 106 with the second signal 112, yielding a modified first signal 106' that is synchronized with the second signal 112. The mechanism 104 includes a pulse generator 110. The pulse generator 110 generates a pulse 108 that is indicative of a desired phase delay to be introduced into the first signal 106 so that it becomes synchronized with the second signal 112. The pulse 108 in one embodiment has a length proportional to the desired phase delay. That is, the pulse 108 in one embodiment has a length proportional to the phase difference between the first signal 106 and the second signal 112. The mechanism 104 utilizes the pulse 108 to generate the modified first signal 106'. The pulse generator 110 may also be considered the means for performing its functionality. In one embodiment, the mechanism 104 is inclusive of the signal provider 102.

Figure 2A:
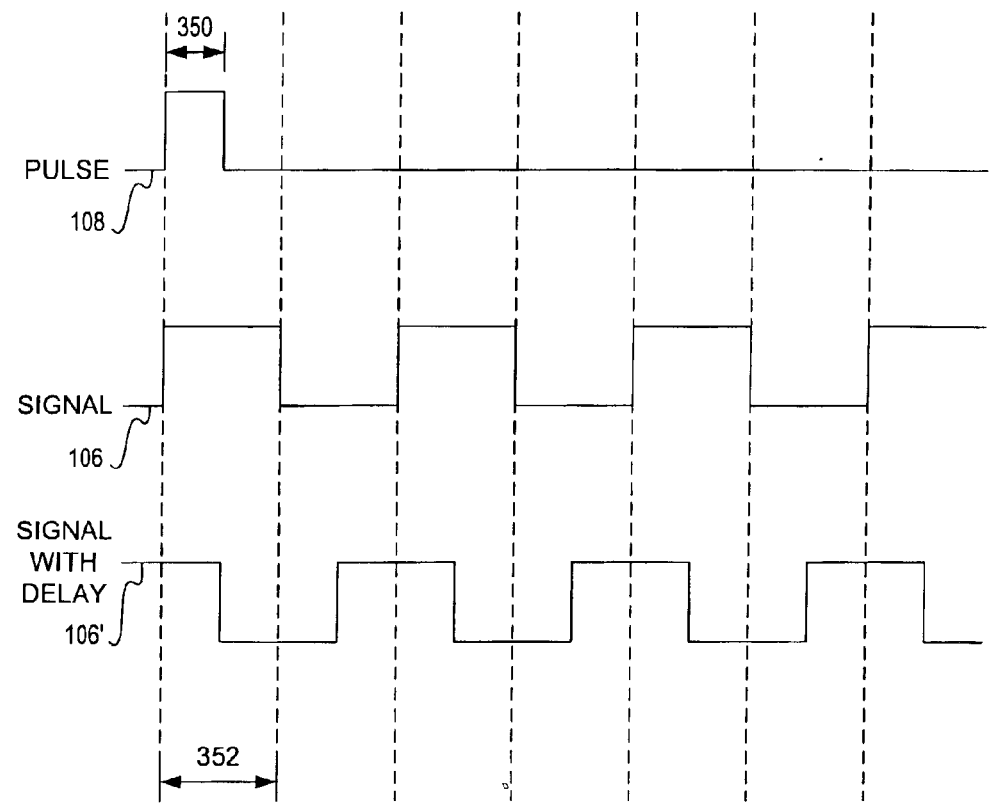
FIGS. 2A, 2B, and 2C are timing diagrams showing how pulses of different lengths introduce different phase delays into a first signal, so that the first signal can be synchronized with a second signal, according to an embodiment of the invention.
Figure 2B:
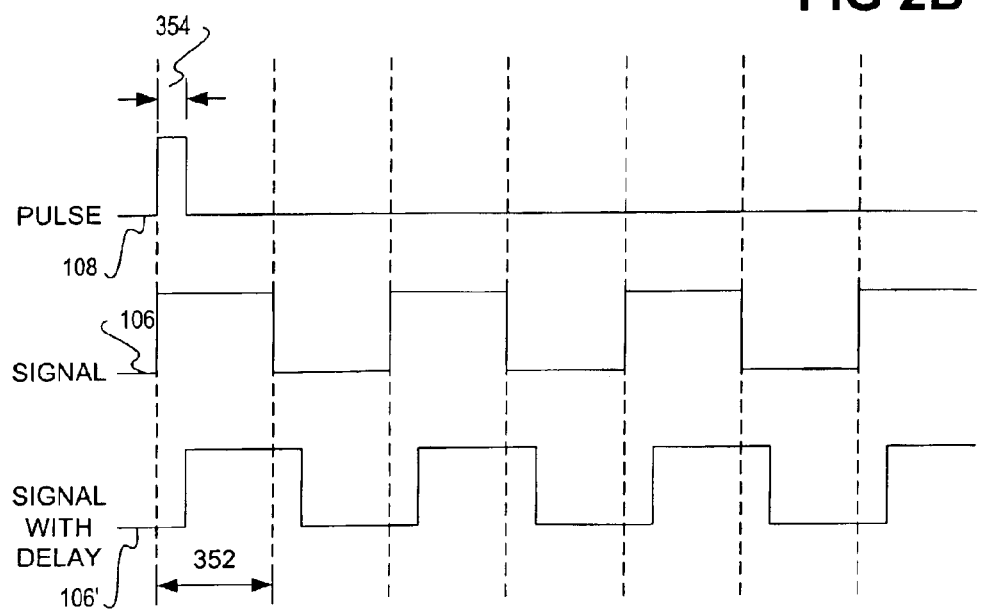
Figure 2C:
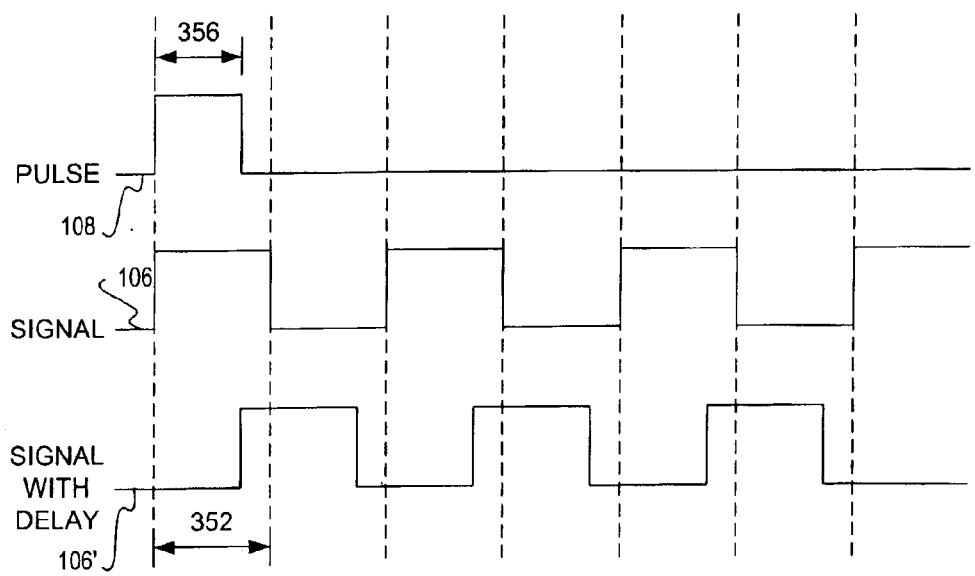

FIGS. 2A, 2B, and 2C are timing diagrams showing examples of how different lengths of the pulse 108 affect the phase delay introduced into the first signal 106, according to varying embodiments of the invention, so that the signal 106 becomes synchronized with the second signal 112, as the modified first signal 106'. In FIG. 2A, the length 350 of the pulse 108 is one-half of the clock cycle length 352. This introduces a 180-degree phase delay into the signal 106, such that the modified signal 106' is 180 degrees out of phase as compared to the signal 106. In FIG. 2B, the length 354 of the pulse 108 is one-quarter of the clock cycle length 352, introducing a 90-degree phase delay into the signal 106, such that the modified signal 106' is 90 degrees out of phase relative to the signal 106.

In FIG. 2C, the length 356 of the pulse 108 is three-quarters of the clock cycle length 352, introducing a 270-degree phase delay into the signal 106, resulting in the modified signal 106' being 270 degrees out of phase relative to the signal 106. In general, in one embodiment the proportion of the length of the pulse 108 relative to the clock cycle length 352 is the proportion of 360 degrees by which the signal 106 will be delayed, resulting in the modified signal 106'. That is, the length of the pulse 108, divided by the length of the clock cycle 352, times 360 degrees is the of phase delay that is introduced into the signal 106, in one embodiment of the invention.

For example, the clock cycle length 352 may be twelve nanoseconds. The difference in phase between the first signal 106 and the second signal 112 may be six nanoseconds. Therefore, the pulse 108 is six nanoseconds in length, and the signal 106 is delayed by 180 degrees, or six nanoseconds in this example, becoming the modified signal 106', and corresponding to the timing diagram of FIG. 2A.

Where the pulse 108 is three nanoseconds, representing a difference in phase between the signals 106 and 112 of three nanoseconds, the signal 106 is delayed by 90 degrees, or three nanoseconds in this example, becoming the modified signal 106', and corresponding to the timing diagram of FIG. 2B. Finally, where the pulse 108 is nine nanoseconds, representing a phase difference between the signals 106 and 112 of nine nanoseconds, the signal 106 is delayed by 270 degrees, or nine nanoseconds in this example, becoming the modified signal 106', and corresponding to the timing diagram of FIG. 2C.

Figure 3A:
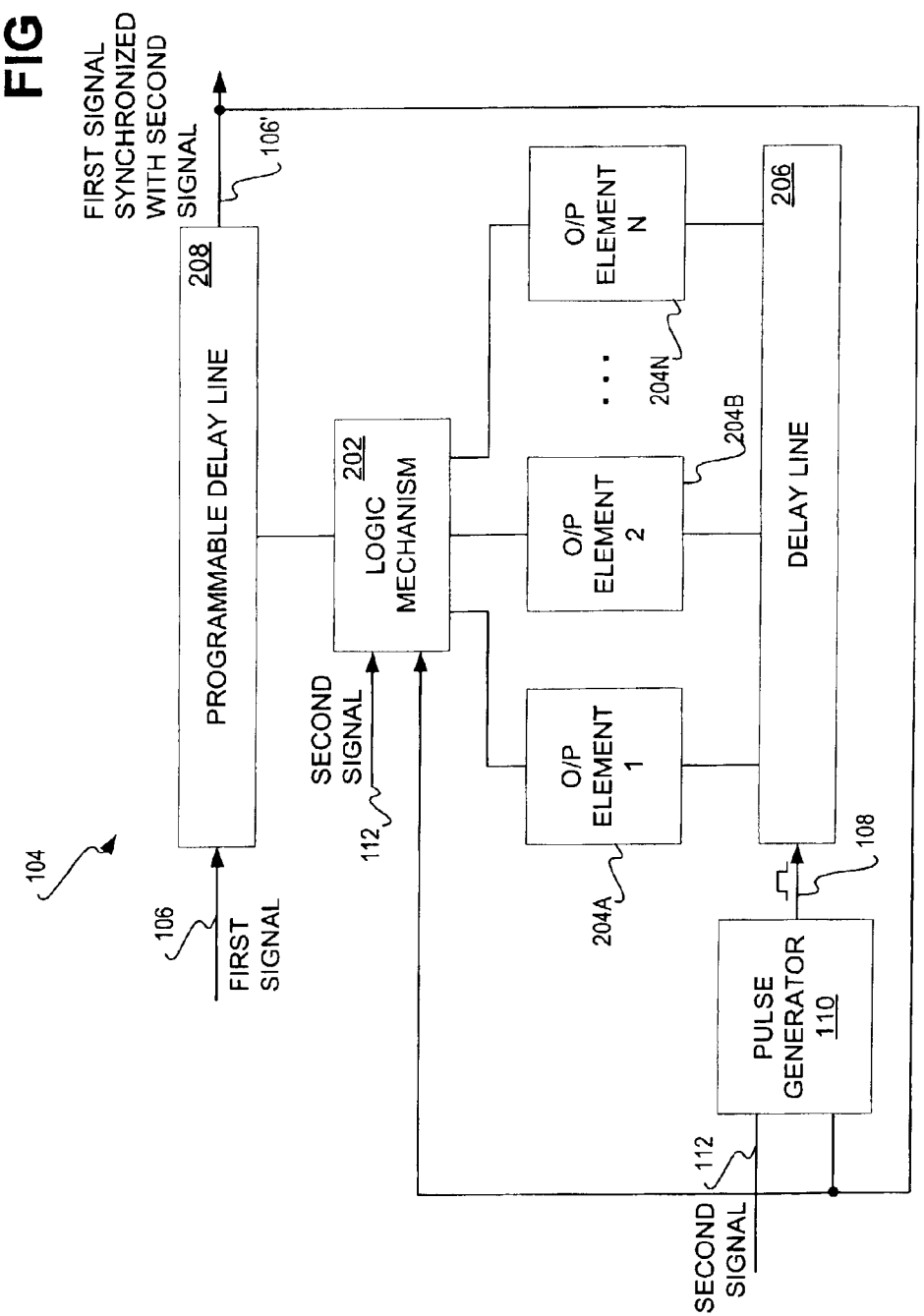

FIGS. 3A and 3B show differing embodiments for implementing the mechanism 104. In FIG. 3A, the mechanism 104 includes a delay line 206, a number of output elements 204A, 204B, . . . , 204N, a logic mechanism 202, and a programmable delay line 208. The mechanism 104 also includes the pulse generator 110, as before. Each of the components of FIG. 3A can be considered as the means for performing its respective functionality.

The pulse generator 110 in the embodiment of FIG. 3A specifically determines the phase difference between the second signal 112 and the output of the programmable delay line 208, which ultimately becomes the modified first signal 106', representing the first signal 106 as synchronized with the second signal 112. That is, the mechanism 104 utilizes feedback such that the modified first signal 106' is an input to the pulse generator 110. The modified first signal 106' is initially the first signal 106, such that the pulse 108 represents the phase difference between the first signal 106 and the second signal 112. Thus, the pulse generator 110 effectively receives as inputs both the first signal 106 and the second signal 112 in this embodiment. Once the modified first signal 106' is synchronized with the second signal 112, the pulse 108 is a flat line, such that there is no pulse in actuality.

The output elements 204A, 204B, . . . , 204N are collectively referred to as the output elements 204. The delay line 206 sets at least some of the output elements 204 based on the pulse 108 generated by the pulse generator 110. The delay line 206 thus effectively measures the length of the pulse 108, where the length of the pulse 108 is proportional to the phase difference between the signals 106 and 112. The delay line 206 sets at least some of the output elements 204 in proportional correspondence with the length of the pulse 108.

The logic mechanism 202 may be implemented as hardware, software, or a combination of hardware and software, as can be appreciated by those of ordinary skill within the art. The logic mechanism 202 counts the number of the output elements 204 that have been set by the delay line 206. In response, the logic mechanism 202 programs the programmable delay line 208 based on this counting. By passing through the programmable delay line 208 as has been so programmed by the logic mechanism 202, the signal 106 is delayed by the phase difference between the first signal 106 and the second signal 112, resulting in the modified signal 106'. The programmable delay line 208 may also be implemented as hardware, software, or a combination of hardware and software, as can be appreciated by those of ordinary skill within the art.

The logic mechanism 202 in one embodiment also has inputs thereto including the second signal 112 and the modified first signal 106'. This is to determine the phase of the first signal 106 relative to the second signal 112, so that it can be determined whether the phase difference between the first signal 106 and the second signal 112 is to be added to or subtracted from the first signal 106 so that the two signals 106 and 112 become synchronized. The modified first signal 106' being input to the logic mechanism 202 thus represents another instance of feedback within the mechanism 104, as is the case with the modified first signal 106' relative to the pulse generator 110.

It is noted that the subtraction of the phase difference from the first signal 106 may occur due to a nominal delay being present in the delay line 208. The subtraction of addition of the phase difference thus occurs relative to this delay. The nominal delay may be an integer number of cycles of the first signal 106, such that when the modified first signal 106' is compared to the second signal 112, the correct phase difference results. As a result, there can be a rising edge of the modified first signal 106' that occurs earlier in time than the corresponding rising edge of the first signal 106.

Whereas the pulse 108 represents the magnitude of the phase difference between the first signal 106 and the second signal 112, the mechanism 202 determines in this embodiment whether this difference is to be added to or subtracted from the first signal 106 in yielding the modified first signal 106' that is synchronized with the second signal 112. As is the case with the pulse generator 110, the logic mechanism 202 in actuality receives the modified first signal 106' as an input. The modified first signal 106' is initially the first signal 106 until it becomes synchronized with the second signal 112. Thus, the logic mechanism 202 effectively receives as inputs both the first signal 106 and the second signal 112 in this embodiment.

As an example of operation of the mechanism 104 of the embodiment of FIG. 3A, there may be twelve of the output elements 204. The length of the pulse 108 is a fraction of the clock cycle length 352 of FIGS. 2A–2C, where the clock cycle length 352 may be twelve nanoseconds in length. If the pulse 108 has a length of six nanoseconds, representing a phase difference between the signals 106 and 112 of six nanoseconds, then the delay line 206 sets six of the output elements 204, which are counted by the logic mechanism 202 to program the programmable delay line 208 to delay the signal 106 by six nanoseconds, or 180 degrees, in the signal 106 becoming the modified signal 106'. That is, the proportion of the length of the pulse 108 to the clock cycle length 352 is the proportion of the output elements 204 that the delay line 206 sets, and which the logic mechanism 202 counts to correspondingly program the programmable delay line 208.

The mechanism 104 of the embodiment of FIG. 3A is non-iterative. The pulse 108 results in the delay line 206 setting at least some of the output elements 204, which are counted by the logic mechanism 202 to program the programmable delay line 208. The logic mechanism 202 thus programs the programmable delay line 208 with the delay to be introduced into the signal 106, either by addition or subtraction, as has been described. Once the signal 106 passes through the programmable delay line 208, the resulting signal 106' is synchronized with the signal 112. No further modification of the delay of the signal 106' is needed to achieve synchronization. That is, no iterative actions are taken to synchronize the signal 106, as the resulting signal 106', with the signal 112.

In FIG. 3B, the mechanism 104 includes elements 302, including the elements 303A, 303B, . . . , 302N, as well as the logic mechanism 202 and the programmable delay line 208. The mechanism 104 also includes the pulse generator 110, as before. The pulse generator 110 in the embodiment of FIG. 3B, as in the embodiment of FIG. 3A, specifically determines the phase difference between the second signal 112 and the output of the programmable delay line 208, which ultimately becomes the modified first signal 106'. The mechanism 104 utilizes feedback such that the modified first signal 106' is an input to the pulse generator 110, in addition to the second signal 112 being an input. Furthermore, each of the components of FIG. 3B can be considered the means for performing its respective functionality.

A number of the elements 302 are set based on the pulse 108. That is, a number of the elements 302 are set in proportional correspondence to the length of the pulse 108, where the length of the pulse 108 is proportional to the phase difference between the signals 106 and 112. The logic mechanism 202 then counts the number of the elements 302 that have been set, and correspondingly programs the programmable delay line 208 based on this counting. By passing through the programmable delay line 208 as has been programmed, the signal 106 becomes synchronized with the signal 112, as the modified signal 106'.

As is the case in the embodiment of FIG. 3A, the logic mechanism 202 of the embodiment of FIG. 3B may have inputs thereto including the second signal 112 and the modified signal 106, to determine the phase of the first signal 106 relative to the second signal 112. Thus, the logic mechanism 202 in this embodiment is able to determine whether the phase difference between the signals 106 and 112 is to be added to or subtracted from the first signal 106, so that the signals 106 and 112 become synchronized. The modified first signal 106' being input to the logic mechanism 202 thus represents another instance of feedback within the mechanism 104, as is the case with the modified first signal 106' relative to the pulse generator 110.

As an example of operation of the mechanism 104 of the embodiment of FIG. 3B, there may be nine of the elements 302. The length of the pulse 108 is a fraction of the clock cycle length 352 of FIGS. 2A–2C, where the clock cycle length 352 may be twelve nanoseconds in length. If the pulse 108 is four nanoseconds in length, representing a phase difference between the signals 106 and 112 of four nanoseconds, then three of the elements 302 are set. These elements are counted by the logic mechanism 202 to program the programmable delay line 208 to delay the signal 106 by four nanoseconds, or 120 degrees, in the signal 106 becoming the modified signal 106' that is synchronized with the signal 112. The proportion of the length of the pulse 108 to the clock cycle 352 is the proportion of the elements 302 that the pulse 108 sets, and which the logic mechanism 202 counts to correspondingly program the programmable delay line 208.

The mechanism 104 of the embodiment of FIG. 3B is non-iterative. The pulse 108 sets at least some of the elements 302, which are counted by the logic mechanism 202 to program the programmable delay line 208. The logic mechanism 202 thus programs the programmable delay line 208 with the desired phase delay to be introduced into the signal 106, either by addition or subtraction, as has been described. Once the signal 106 passes through the programmable delay line 208, the resulting signal 106' is synchronized with the signal 112. No further delay of the signal 106' is needed to achieve synchronization. That is, no iterative actions are taken to synchronize the signal 106, as the signal 106', with the signal 112.

Circuit of Specific Embodiment

Figure 4:
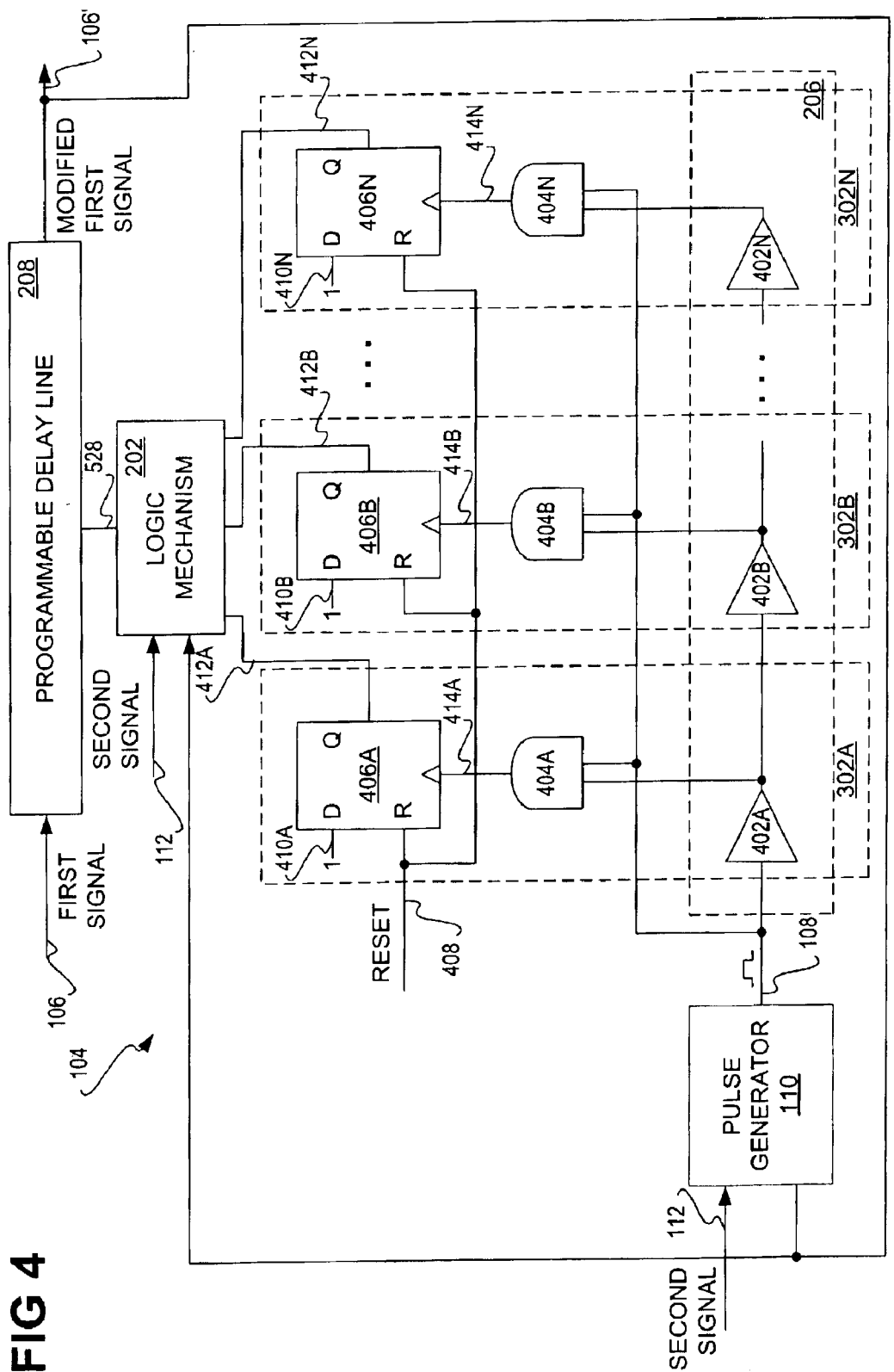
FIG. 4 is a circuit diagram of a mechanism to non-iteratively synchronize a first signal with a second signal, according to an embodiment of the invention.

FIG. 4 shows a more detailed implementation of the mechanism 104, according to an embodiment of the invention. The mechanism 104 of the embodiment of FIG. 4 is consistent with the mechanism 104 of each of the embodiments of FIGS. 3A and 3B. The mechanism 104 of the embodiment of FIG. 4 includes a number of delay elements 402A, 402B, ..., 402N, collectively referred to as the delay elements 402, a number of AND gates 404A, 404B, ..., 404N, collectively referred to as the AND gates 404, and a number of flip-flops 406A, 406B, ... 406N, collectively referred to as the flip-flops 406. The mechanism 104 also includes the pulse generator 110, the logic mechanism 202, and the programmable delay line 208.

Each of the components of FIG. 4 can be considered the means for performing its respective functionality. Furthermore, the delay line 206 of FIG. 3A can be considered in one embodiment to include the delay elements 402, as shown in FIG. 4, and the output elements 204 of FIG. 3A can be considered to include the flip-flops 406 and/or the AND gates 404. The elements 302 of FIG. 3B can be considered in one embodiment to include the delay elements 402, the AND gates 404, and/or the flip-flops 406, as is shown in FIG. 4.

The pulse generator 110 generates the pulse 108 based on the second signal 112 and effectively on the first signal 106, as the modified first signal 106'. The pulse 108 propagates through the delay elements 402. Each of the delay elements 402 delays the pulse 108 from reaching a successive one of the delay elements 402 by a predetermined length of time. In one embodiment, the delay elements 402 are combinatorial logic devices, or are analog devices. The output of each of the delay elements 402, as well as the pulse 108, serve as the inputs to the AND gates 404. Each of the AND gates 404 thus output a logic one only when both of its inputs are high. For example, if the pulse 108 has a length of five nanoseconds, and each of the delay elements 402 represents a delay of one nanosecond, five of the AND gates 404 will output logic ones.

This is because the pulse 108 is asserted on one of the inputs of each of the AND gates 404 for five nanoseconds, and just the first five of the delay elements 402 will assert inputs of their corresponding gates of the AND gates 404 during these five nanoseconds. With respect to each of the other of the AND gates 404, for the first five nanoseconds one of the inputs will be high resulting from the pulse 108, but the other of the inputs will be low, because the pulse 108 has not yet propagated through its corresponding one of the delay elements 402. Some time after the first five nanoseconds, another of the inputs of each of the other of the AND gates 404 will be high for five nanoseconds, resulting from the pulse 108 propagating through a corresponding one of the delay elements 402. However, at that point the other inputs to the AND gates 404 resulting from the pulse 108 will already be low.

The reset line 408 is asserted and then deasserted prior to the pulse 108 being asserted, such as by the provider 102 of FIG. 1. The reset line 408 asynchronously resets the flip-flops 406 so that their outputs 412, which encompass the outputs 412A, 412B, ..., 412N, are logic zeros unless changed. Logic ones are asserted on the inputs 410, which encompass the inputs 410A, 410B, ..., 410N, of the flip-flops 406.

Thus, when the clock inputs 414, which encompass the clock inputs 414A, 414B, ..., 414N, of the flip-flops 406 transition from low to high, the outputs 412 correspondingly switch to logic ones. If the clock inputs 414 do not transition from low to high, however, the outputs 412 of the flip-flops 406 remain at logic zeros. The outputs of the AND gates 404 in effect latch their corresponding flip-flops 406 when they transition from low to high. The flip-flops 406, in other words, indicate whether their corresponding AND gates 404 ever output logic ones, even after the AND gates 404 have reverted back to outputting logic zeros.

The logic mechanism 202 is then able to count the number of the flip-flops 406 that are outputting logic ones on their outputs 412. In response to this counting, the logic mechanism 202 correspondingly programs the programmable delay line 208, via the programming line 528. That is, the mechanism 202 programs the programmable delay line 208 based on the number of the flip-flops 406 that it has counted as outputting logic ones on their outputs 412, to synchronize the first signal 106 with the second signal 112. A greater or a lesser number of flip-flops 406 outputting logic ones results in the logic mechanism 202 programming the programmable delay line 208 with a greater or a lesser delay, respectively. The direction of the delay is based on a comparison of the phase of the second signal 112 and the first signal 106 as modified as the modified first signal 106'. This introduces a corresponding phase delay into the signal 106, resulting in modified first signal 106' being in phase with the second signal 112.

An example is illustrative in describing operation of the mechanism 104 of the embodiment of FIG. 4. There may be ten of the delay elements 402, ten of the AND gates 404, and ten of the flip-flops 406. The clock cycle length may be ten nanoseconds, the pulse 108 may be five nanoseconds in length, and each of the delay elements 402 may represent a one-nanosecond delay. The flip-flops 406 are reset via the reset line 408 before the pulse 108 is asserted.

During the five nanoseconds of the pulse 108, the first five of the delay elements 402 are able to propagate the pulse 108 such that the corresponding first five of the AND gates 404 have both their inputs high. For the last five of the AND gates 404, during the five nanoseconds of the pulse 108 only one of each of their inputs is high, due to the pulse 108. The other input of each of these last five of the AND gates 404 remains low during these five nanoseconds, because the pulse 108 has not yet propagated through the corresponding last five of the delay elements 402. After the five nanoseconds of the pulse 108, one of each of their inputs will then be low, due to the pulse 108 having expired.

Therefore, the first five of the AND gates 404 transition the clock inputs 414 of the corresponding first five of the flip-flops 406 from low to high. These first five of the flip-flops 406 latch their corresponding outputs 412 at logic ones, and the outputs 412 of these first five of the flip-flops 406 remain at logic ones even after the first five of the AND gates 404 no longer assert their corresponding clock inputs 414. This enables the logic mechanism 202 to have sufficient time to count the number of the flip-flops 406 that have their outputs 412 at logic ones. The logic mechanism 202 thus counts five of the flip-flops 406 as outputting logic ones, and may correspondingly program either a positive or a negative five-nanosecond delay into the programmable delay line 208, depending on whether the phase of the modified first signal 106' is before or after that of the second signal 112. The delay line 208 then delays the first signal 106 by five nanoseconds, resulting in the modified signal 106' being in synchronization with the second signal 112.

As has been described, the flip-flops 406 are in one embodiment edge-triggered devices, meaning that they latch on the leading transition from low to high, or the lagging transition from high to low. However, in another embodiment, they may be level-triggered devices, meaning that they latch on a high input signal, and not on the transition from high to low or from low to high. Other types of devices are also amenable to embodiments of the invention.

Figure 5A:
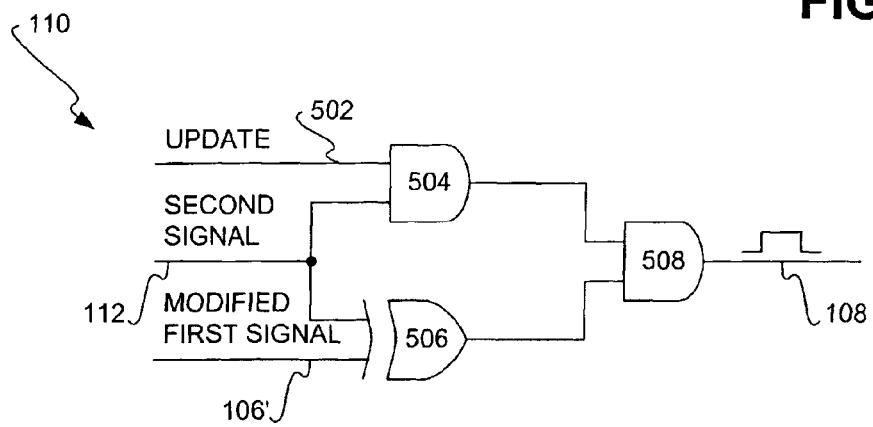
FIGS. 5A and 5B are circuit diagrams of a pulse generator and a logic mechanism, respectively, that can be used in conjunction with the embodiments of FIGS. 1, 3A, 3B, and/or 4, according to an embodiment of the invention.
Figure 5B:
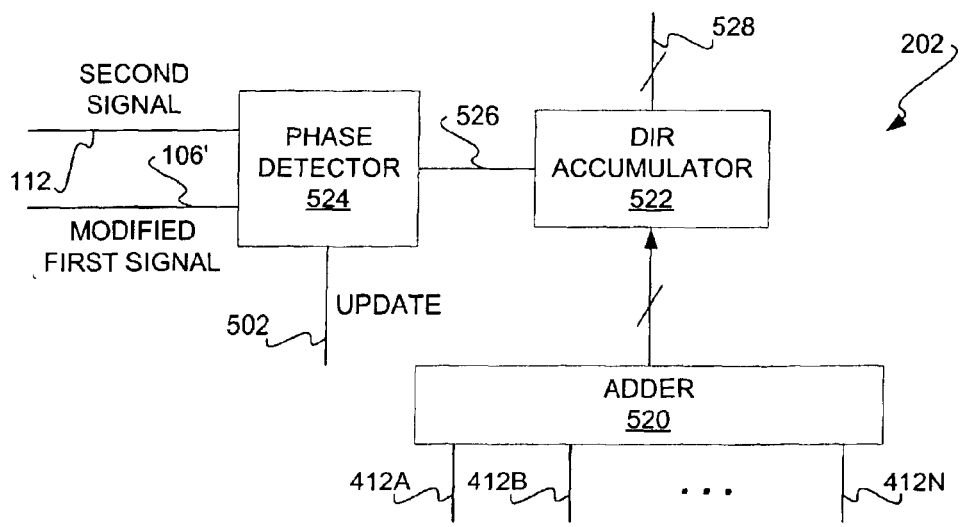

FIGS. 5A and 5B show embodiments of the pulse generator 110 and of the logic mechanism 202, respectively, that can be used in conjunction with the mechanism 104 of the embodiments of FIGS. 3A, 3B, and/or 4. In FIG. 5A, the pulse generator 110 includes AND gates 504 and 508, and an exclusive-or (XOR) gate 506. The inputs to the AND gate 504 include an update line 502 and the second signal 112, whereas the inputs to the XOR gate 506 include the second signal 112 and the modified first signal 106'. The update line 502 is asserted high when then first signal 106 is desired to be synchronized with the second signal 112 as the first signal 106', and is asserted high until the first signal 106 has been synchronized with the second signal 112, usually within one clock cycle.

Therefore, the AND gate 504 serves to output a logic one when both the second signal 112 is asserting high, and the update line 502 has been asserted high. The XOR gate 506 actually generates the pulse that ultimately becomes the pulse 108. It accomplishes this by performing an XOR operation on the second signal 112 and the modified first signal 106'. When the second signal 112 and the modified first signal 106' are out of synch, such that one of the signals 112 and 106' is high and the other of the signals is low, the XOR gate 506 outputs a logic one. When both the second signal 112 and the modified first signal 106' are either low or high, the XOR gate 506 outputs a logic zero. That is, when the second signal 112 and the modified first signal 106' are synchronized, the XOR gate 506 outputs a logic zero. The pulse specifically output by the XOR gate 506 is indicative of, and preferably proportional to, the amount of phase delay that is to be added to or subtracted from the first signal 106 to become synchronized with the second signal 112.

The AND gate 508 acts to output the pulse generated by the XOR gate 506 as the pulse 108 when the AND gate 504 has output a logic one. In another embodiment of the invention, the input to the AND gate 508 is replaced by just the update line 502, such that the AND gate 504 is not present. This effectively performs the same functionality as the pulse generator 110 of the embodiment shown in FIG. 5A. Furthermore, in another embodiment of the invention, the pulse generator 110 can be just the XOR gate 506, having as inputs the second signal 112 and the modified signal 106', and having its output serve as the pulse 108. In this embodiment, the update line 502 is not present, such that the first signal 106 is constantly modified to be synchronized with the second signal 112.

In FIG. 5B, the logic mechanism 202 includes an adder 520, an accumulator 522, and a phase detector 524. Each of these components may be considered the means for performing its respective functionality. The adder 520 counts, or adds together, the number of the outputs 412 of the flip-flops 406 of FIG. 4 that have been latched high, or at logic ones. In response, the adder 520 sets a number of bits of the accumulator 522 as the binary equivalent of the number of the outputs 412 that have been latched high. For example, if the adder 520 counts five of the outputs 412 as outputting logic ones, and the accumulator 522 has three bits reserved for magnitude, the adder sets these bits of the accumulator 522 at 0x101, which is the binary equivalent of five.

The phase detector 524 is in one embodiment a one-bit phase detector. The phase detector 524 detects whether the phase of the modified first signal 106' is ahead of or behind the phase of the second signal 112. The phase detector 524 may output the results of its comparison when the update line 502 is asserted high. That is, the phase detector 524 is operational when the update line 502 is asserted high. The phase detector 524 outputs a logic one bit when the modified first signal 106' has a phase ahead of the phase of the second signal 112, and outputs a logic zero when the phase of the signal 106' is behind the phase of the signal 112.

This bit serves as the sign, or direction or carrier, bit 526 for the accumulator 522. When the bit is set to logic one, this means that the accumulator 522 is indicating on the programming line 528 of the programmable delay line 208 of FIGS. 3A, 3B, and/or 4 that the magnitude of the accumulator 522 set by the adder 520 is to be subtracted from the first signal 106 to yield the modified first signal 106'. When the bit is set to logic zero, this means that the accumulator 522 is indicating on the line 528 that the magnitude of the accumulator 522 set by the adder 520 is to be added to the first signal 106 to yield the modified first signal 106'. For instance, if the magnitude of the accumulator 522 has been set to binary five, or 0x101, and the accumulator 522 has four bits, the programming line 528 is set to 0x1101 to indicate subtraction, and 0x0101 to indicate addition, where the leading bit is the sign, or direction or carrier, bit 526.

Method

Figure 6:
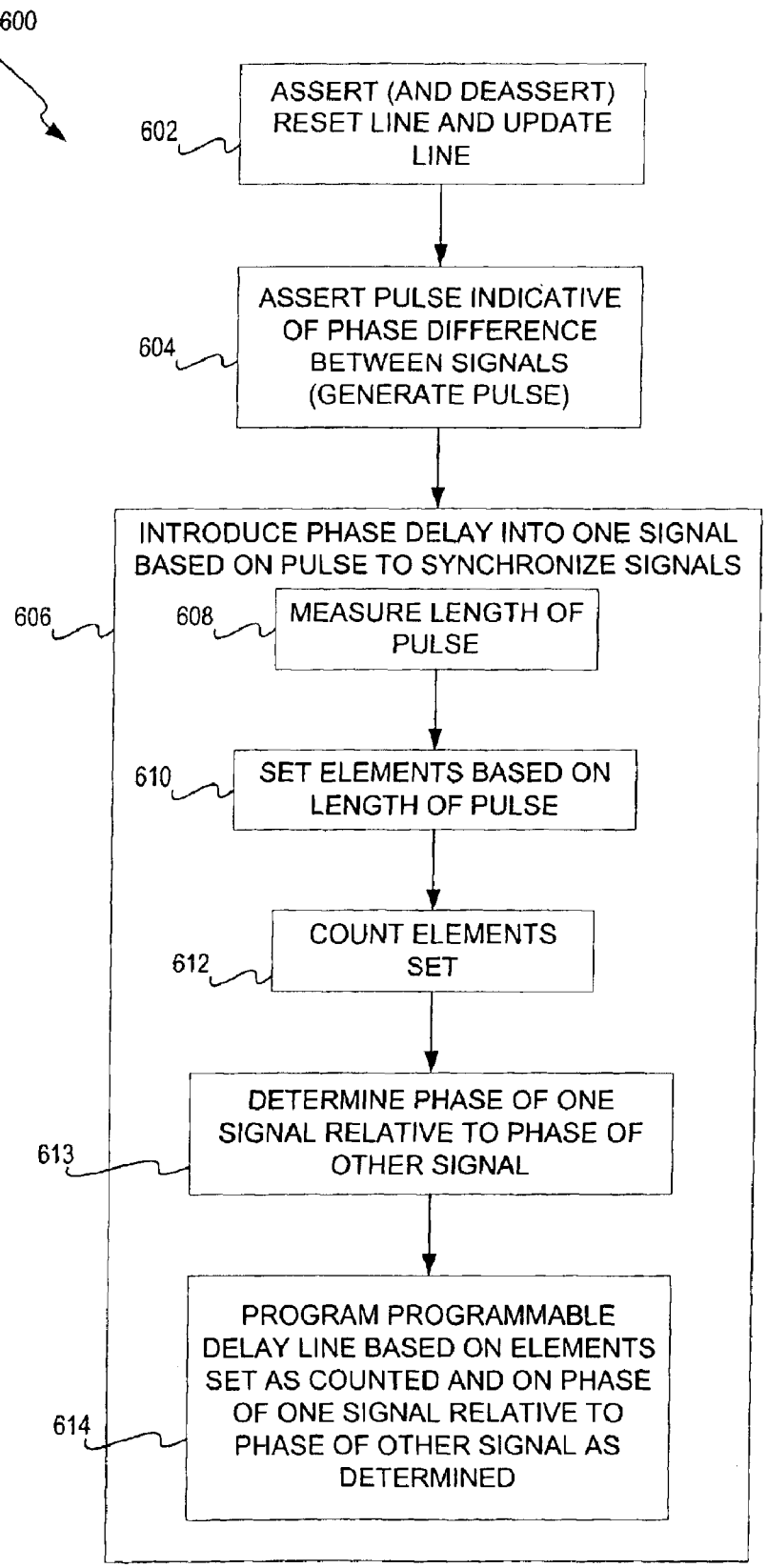
FIG. 6 is a flowchart of a method according to an embodiment of the invention.

FIG. 6 shows a method 600 according to an embodiment of the invention. The method 600 may be performed at least in part by the system 100 of FIG. 1 and/or the mechanism 104 of FIGS. 3A, 3B, and/or 4. First, a reset line and an update line are asserted, and then optionally deasserted, as necessary (602), such as the reset line 408 of FIG. 4 and the update line 502 of FIGS. 5A and 5B. Next, a pulse is asserted, where the pulse is indicative of phase difference between a first signal and a second signal (604). The pulse may be the pulse 108 of FIGS. 1, 2A–2C, 3A–3B, 4, 5A, and/or 5B. The pulse may be generated, such as by the pulse generator 110 of FIGS. 1, 3A–3B, 4, and/or 5A. The first signal may be the first signal 106, and the second signal may be the second signal 112, of FIGS. 1, 2A–2C, 3A–3B, 4, 5A, and/or 5B. Finally, a phase delay is introduced into the first signal, based on the asserted pulse, to synchronize the first signal with the second signal (606). The phase delay may be subtracted from or added to the first signal to synchronize the first signal with the second signal.

Introducing the phase delay into the first signal so that it is synchronized with the second signal can be accomplished as follows. First, the length of the pulse is measured (608). The length of the pulse may be measured, for instance, by the delay line 206 of FIG. 3A. Elements are then set based on the length of the pulse as measured (610). These elements may be the output elements 204 of FIG. 3A, the elements 302 of FIG. 3B, and/or the flip-flops 406 of FIG. 4. The elements that have been set are counted (612), such as by the logic mechanism 202 of FIGS. 1, 3A–3B, 4, and/or 5B. The phase of the first signal relative to the phase of the second signal is determined (613), to determine whether the phase delay should be added to or subtracted from the first signal. This determination can be accomplished by the phase detector 524 of FIG. 5B. Finally, a programmable delay line is programmed based on the elements that have been set as counted (614), such as the programmable delay line 208 of FIGS. 1, 3A–3B, and/or 4. The first signal is thus synchronized with the second signal.

Conclusion

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

I claim:

1. A system comprising:
a provider of a first signal and a second signal; and,
a mechanism to non-iteratively synchronize the first signal with the second signal based on a pulse indicative of a phase difference between the first signal and the second signal, wherein the mechanism comprises:
a plurality of output elements;
a delay line to set a number of the plurality of output elements based on the pulse indicative of the phase difference between the first signal and the second signal;
a programmable delay line programmed based on the number of the plurality of output elements counted to synchronize the first signal with the second signal;
a phase detector to determine a phase of the first signal relative to a phase of the second signal;
an adder to count the number of the plurality of output elements set by the delay line; and,
an accumulator to program the programmable delay line to synchronize the first signal with the second signal based on the phase determined by the phase detector and the number of the plurality of output elements counted by the adder.

2. The system of claim 1, wherein the mechanism further comprises a pulse mechanism to generate the pulse indicative of the difference between the first signal and the second signal.

3. The system of claim 1, wherein the delay line comprises a plurality of delay elements corresponding to the plurality of output elements to measure the pulse, a number of which correspondingly set the number of the plurality of output elements based on a length of the pulse as being proportional to the phase difference between the first signal and the second signal.

4. A system comprising:
means for providing a first signal and a second signal; and,
means for non-iteratively synchronizing the first signal with the second signal,
wherein the means for non-iteratively synchronizing the first signal with the second signal comprises:
a plurality of elements, a number of which are set in proportional correspondence with a length of a pulse indicative of a phase difference between the first signal and the second signal;
a logic mechanism to count the number of the plurality of elements set and to determine a phase of the first signal relative to a phase of the second signal; and,
a programmable delay line programmed by the logic mechanism based on the number of the plurality of elements counted to synchronize the first signal with the second signal,
and wherein the logic mechanism comprises:
a phase detector to determine the phase of the first signal relative to the phase of the second signal;
an adder to count the number of the plurality of elements set; and,
an accumulator to program the programmable delay line to synchronize the first signal with the second signal based on the phase determined by the phase detector and the number of the plurality of elements counted by the adder.

5. The system of claim 4, wherein the mechanism further comprises a pulse mechanism to generate the pulse indicative of the difference between the first signal and the second signal.

6. The system of claim 4, wherein each element comprises:
a delay element; and,
a flip-flop.

7. A circuit to synchronize a first signal with a second signal comprising:
a pulse mechanism to generate a pulse indicative of a phase difference between the first signal and the second signal, the pulse mechanism comprising an XOR gate;
a delay line to measure a length of the pulse;
a plurality of output elements, a number of which are set based on the length of the pulse measured;
a logic mechanism to count the number of the plurality of output elements set and to determine a phase of the first signal relative to a phase of the second signal; and,
a programmable delay line programmed by the logic mechanism based on the number of the plurality of output elements counted to synchronize the first signal with the second signal.

8. The circuit of claim 7, wherein the delay line comprises a plurality of delay elements corresponding to the plurality of output elements, a number of which correspondingly set the number of the plurality of output elements based on the length of the pulse measured as being proportional to the phase difference between the first signal and the second signal.

9. The circuit of claim 8, further comprising a plurality of AND gates between the plurality of delay elements of the delay line and the plurality of output elements.

10. The circuit of claim 7, wherein the plurality of output elements comprises a plurality of flip-flops.

11. A circuit to synchronize a first signal with a second signal comprising:
   a pulse mechanism to generate a pulse indicative of a phase difference between the first signal and the second signal;
   a delay line to measure a length of the pulse;
   a plurality of output elements, a number of which are set based on the length of the pulse measured;
   a logic mechanism; and,
   a programmable delay line programmed by the logic mechanism based on the number of the plurality of output elements counted to synchronize the first signal with the second signal,
   wherein the logic mechanism comprises:
      a phase detector to determine a phase of the first signal relative to a phase of the second signal;
      an adder to count the number of the plurality of output elements set by the delay line; and,
      an accumulator to program the programmable delay line to synchronize the first signal with the second signal based on the phase determined by the phase detector and the number of the plurality of output elements counted by the adder.

12. A circuit to synchronize a first signal with a second signal comprising:
   a pulse mechanism to generate a pulse indicative of a phase difference between the first signal and the second signal, the pulse mechanism comprising an XOR gate;
   a plurality of output elements;
   a delay line to set a number of the plurality of output elements based on the pulse;
   a logic mechanism to count the number of the plurality of output elements set by the delay line and to determine a phase of the first signal relative to a phase of the second signal; and,
   a programmable delay line programmed by the logic mechanism based on the number of the plurality of output elements counted to synchronize the first signal with the second signal.

13. The circuit of claim 12, wherein the plurality of output elements comprises a plurality of flip-flops.

14. The circuit of claim 12, wherein the delay line comprises a plurality of delay elements corresponding to the plurality of output elements to measure the pulse, a number of which correspondingly set the number of the plurality of output elements based on a length of the pulse as being proportional to the phase difference between the first signal and the second signal.

15. The circuit of claim 14, further comprising a plurality of AND gates between the plurality of delay elements of the delay line and the plurality of output elements.

16. A circuit to synchronize a first signal with a second signal comprising:
   a pulse mechanism to generate a pulse indicative of a phase difference between the first signal and the second signal;
   a plurality of output elements;
   a delay line to set a number of the plurality of output elements based on the pulse;
   a logic mechanism to count the number of the plurality of output elements set by the delay line and to determine a phase of the first signal relative to a phase of the second signal; and,
   a programmable delay line programmed by the logic mechanism based on the number of the plurality of output elements counted to synchronize the first signal with the second signal,
   wherein the logic mechanism comprises:
      a phase detector to determine the phase of the first signal relative to the phase of the second signal;
      an adder to count the number of the plurality of output elements set; and,
      an accumulator to program the programmable delay line to synchronize the first signal with the second signal based on the phase determined by the phase detector and the number of the plurality of output elements counted by the adder.

17. A circuit to synchronize a first signal with a second signal comprising:
   a pulse mechanism to generate a pulse indicative of a phase difference between the first signal and the second signal and to determine a phase of the first signal relative to a phase of the second signal, the pulse mechanism comprising an XOR gate;
   a plurality of elements, a number of which are set in proportional correspondence with a length of the pulse;
   a logic mechanism to count the number of the plurality of elements set; and,
   a programmable delay line programmed by the logic mechanism based on the number of the plurality of elements counted to synchronize the first signal with the second signal.

18. The circuit of claim 17, wherein the length of the pulse is proportional to the phase difference between the first signal and the second signal.

19. The circuit of claim 17, wherein each element comprises:
   a delay element; and,
   a flip-flop.

20. The circuit of claim 19, wherein each element further comprises an AND gate.

21. A circuit to synchronize a first signal with a second signal comprising:
   a pulse mechanism to generate a pulse indicative of a phase difference between the first signal and the second signal;
   a plurality of elements, a number of which are set in proportional correspondence with a length of the pulse;
   a logic mechanism to count the number of the plurality of elements set; and,
   a programmable delay line programmed by the logic mechanism based on the number of the plurality of elements counted to synchronize the first signal with the second signal,
   wherein the logic mechanism comprises:
      a phase detector to determine a phase of the first signal relative to a phase of the second signal;
      an adder to count the number of the plurality of elements set; and,
      an accumulator to program the programmable delay line to synchronize the first signal with the second signal based on the phase determined by the phase detector and the number of the plurality of elements counted by the adder.

22. A circuit to synchronize a first signal with a second signal comprising:
   a plurality of output elements;
   means for setting a number of the plurality of output elements based on a pulse indicative of a phase difference between the first signal and the second signal;

means for counting the number of the plurality of output elements set by the means for setting; and, a programmable delay line programmed by the means for counting based on the number of the plurality of output elements counted to synchronize the first signal with the second signal, wherein the means for counting comprises:
a phase detector to determine a phase of the first signal relative to a phase of the second signal;
an adder to count the number of the plurality of output elements set; and,
an accumulator to program the programmable delay line to synchronize the first signal with the second signal based on the phase determined by the phase detector and the number of the plurality of output elements counted by the adder.

23. The circuit of claim 22, further comprising means for generating the pulse.

24. The circuit of claim 22, wherein the pulse has a length proportional to the desired phase delay.

25. The circuit of claim 22, wherein the means for setting comprises a plurality of delay elements corresponding to the plurality of output elements, the means setting the number of the plurality of output elements as a proportion of the plurality of output elements corresponding to the pulse.

26. A method comprising:
asserting a pulse indicative of a phase difference between a first signal and a second signal; and,
introducing a phase delay into the first signal based on the pulse asserted to synchronize the first signal with the second signal wherein introducing the phase delay into the first signal based on the pulse asserted comprises:
measuring a length of the pulse, the length of the pulse proportional to the phase difference between the first signal and the second signal;
setting a plurality of output elements based on the length of the pulse measured;
counting the plurality of output elements set, using an adder;
determining a phase of the first signal relative to a phase of the second signal;
programming a programmable delay line using an accumulator, to synchronize the first signal with the second signal based on the plurality of output elements set as counted and the phase of the first signal relative to the phase of the second signal as determined.

27. The method of claim 26, further initially comprising asserting and deserting a reset line and asserting and deasserting an update line.

28. The method of claim 26, wherein asserting the pulse comprises generating the pulse.

* * * * *